United States Patent [19]

Nüssel

[11] 4,000,464
[45] Dec. 28, 1976

[54] ARRANGEMENT FOR DETECTING GROUND LEAKS IN THE ROTOR CIRCUIT OF A BRUSHLESS SYNCHRONOUS MACHINE EXCITED BY ROTATING RECTIFIERS

[75] Inventor: Lothar Nüssel, Berlin, Germany

[73] Assignee: Siemens Aktiengesellschaft, Munich, Germany

[22] Filed: June 12, 1975

[21] Appl. No.: 586,165

[30] Foreign Application Priority Data

June 24, 1974 Germany ............... 2430798

[52] U.S. Cl. .................. 324/158 MG; 324/54
[51] Int. Cl.[2] ............... G01R 31/00; G01R 31/12
[58] Field of Search ........... 324/158 MG; 322/99; 318/490; 324/54

[56] References Cited

FOREIGN PATENTS OR APPLICATIONS 178,411  2/1966  U.S.S.R. .............. 324/158 MG

OTHER PUBLICATIONS

Deshpande et al., "A New Method . . . ," IEE, Feb. 1959, p. 46.

*Primary Examiner*—Robert Segal
*Assistant Examiner*—Ernest F. Karlsen
*Attorney, Agent, or Firm*—Keynon & Kenyon Reilly Carr & Chapin

[57] ABSTRACT

The invention is directed to an arrangement for detecting ground leaks and includes two identical synchronous machines coupled to the rotor of a brushlessly excited synchronous machine. One of the identical machines is built as an outer-pole machine and the other as an inner-pole machine. The stator winding of the outer-pole machine is supplied with a constant direct current and its rotor winding is connected through a rectifier bridge to be between ground and the neutral point of the rotor of the brushlessly excited synchronous machine. The rectifier feeds the rotor winding of the inner-pole machine, and the voltage measured at the stator winding of the latter is a measure of the insulation resistance in the rotor circuit of the brushless synchronous machine.

6 Claims, 1 Drawing Figure

U.S. Patent  Dec. 28, 1976  4,000,464
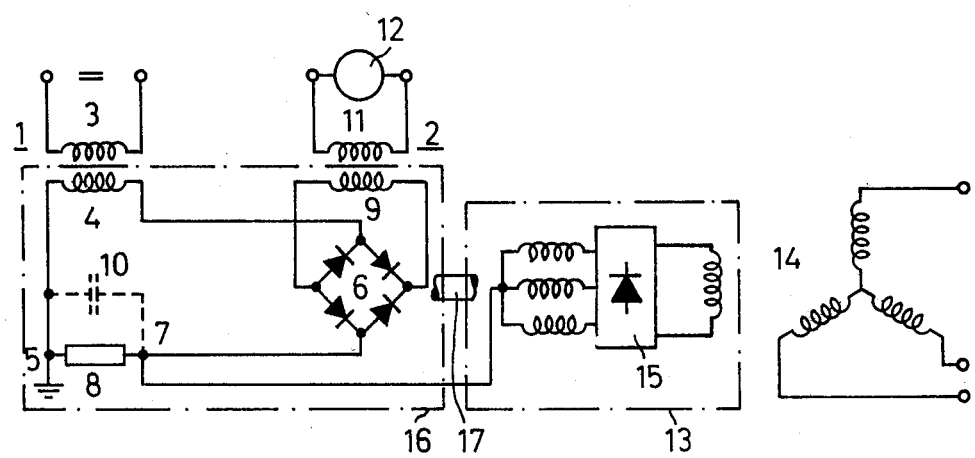

ARRANGEMENT FOR DETECTING GROUND LEAKS IN THE ROTOR CIRCUIT OF A BRUSHLESS SYNCHRONOUS MACHINE EXCITED BY ROTATING RECTIFIERS

BACKGROUND OF THE INVENTION

The rotor circuit of synchronous machines excited without brushes by means of rotating rectifiers is inaccessible. To be able to monitor the rotor circuit for possible ground leaks nevertheless, auxiliary brushes have been provided in the past which were applied temporarily during the tests. However, such auxiliary brushes must be serviced and are also trouble-prone.

Accordingly, it is an object of the invention to provide an arrangement for monitoring the rotor circuit of a brushlessly excited synchronous machine and for detecting possible ground leaks without the need to utilize brushes.

SUMMARY OF THE INVENTION

The foregoing object is achieved by the detection arrangement according to the invention by arranging two identical synchronous machines on the rotor shaft of a brushlessly excited synchronous machine. One of the identical machines is built as an outer-pole machine whose stator winding is supplied with a constant direct-current, while the other is built as an inner-pole machine whose rotor winding is supplied with the rectified current of the rotor winding of the outer-pole machine through the insulation resistance of the rotor circuit of the brushlessly excited synchronous machine. The voltage induced in the stator winding of the synchronous inner-pole machine is measured.

By means of this particular circuit arrangement of the two synchronous machines, the rotor circuit of the brushlessly excited synchronous machine is connected to an alternating current voltage, namely, the voltage of the rotor winding of the synchronous outer-pole machine, and thus forms the load of the outer-pole machine. The two synchronous machines need only be of small power rating and are therefore not very expensive.

The rotor winding of the inner-pole machine is fed by the rectified current of the rotor winding of the outer-pole machine, for which reason its current, that is, the exciter current of the inner-pole machine, is dependent on the fault current in the insulation resistance. Since in addition, the speed of the synchronous machine is constant, the terminal voltage at the stator winding of the inner-pole machine, which is the voltage measured, is likewise proportional to the exciter current which, in turn, is a function of the fault current. By appropriately calibrating the measuring instrument for the voltage at the stator winding of the inner-pole machine it is possible to determine unambiguously the fault current values associated with each voltage value. In addition, this calibration also picks up the influence of the winding capacitance of the rotor circuit which is parallel to the insulation resistance. The arrangement according to the invention thus provides continuous monitoring, requiring no maintenance, of the rotor circuit of the brushlessly excited synchronous machine for possibly occurring ground leaks.

Although the invention is illustrated and described herein as an arrangement for detecting ground leaks in the rotor circuit of a brushless synchronous machine excited by rotating rectifiers, it is nevertheless not intended to be limited to the details shown, since various modifications may be made therein within the scope and the range of the claims. The invention, however, together with additional objects and advantages will be best understood from the following description and in connection with the accompanying drawing.

BRIEF DESCRIPTION OF THE DRAWING

The drawing is an electrical schematic diagram of the detection arrangement according to the invention for detecting ground leaks in the insulated rotor circuit of a brushless synchronous machine.

DESCRIPTION OF THE PREFERRED EMBODIMENTS OF THE INVENTION

The arrangement according to the invention for detecting ground leaks in the rotor circuit 13 of a synchronous machine 14 excited brushlessly by means of rotating rectifiers 15 includes two identical, low-power synchronous machines 1 and 2 whose rotating parts are coupled to the rotating part 16 such as a shaft end 17 of the brushlessly excited synchronous machine 14. However, the synchronous machine 1 is built in the form of an outer-pole machine, the synchronous machine 2 in the form of an inner-pole machine. Outer-pole machines are machines wherein the excitation poles are carried on the stator; whereas, inner-pole machines are those wherein the excitation poles are carried on the rotor.

The machine 1 is schematically represented by its stator winding 3 and rotor winding 4; likewise, machine 2 by its stator and rotor windings 11 and 9, respectively. In order to keep costs as low as possible, both identical synchronous machines 1 and 2 are single-phase machines because the generation of single-phase alternating-currents is sufficient for the proper functioning of the arrangement. To make the coupling of the arrangement to the brushlessly excited synchronous machine 14 simpler, both synchronous machines 1 and 2 may also be combined structurally.

When a constant direct-current is supplied to the stator winding 3 of the outer-pole machine 1, an alternating-current voltage is induced in the rotor winding 4. Since one side of the rotor winding 4 is connected to the ground 5 of the rotor circuit 13 of the brushlessly excited synchronous machine 14 and the other side of rotor 4 is connected to the neutral point 7 of the brushlessly excited synchronous machine 14 through the alternating-current voltage terminals of a rectifier bridge 6, the insulation resistance 8 of the brushlessly excited synchronous machine 14 for all practical purposes constitutes the load of the synchronous outer-pole machine 1. The direct-current voltage terminals of the rectifier bridge 6 are connected to the rotor winding 9 of the inner-pole machine 2. The rectified current in the rotor winding 9 of the inner-pole machine 2 is thus a function of the fault current in the insulation resistance 8. In addition, the rectified current is influenced by the winding capacitance 10 of the rotor circuit of the brushlessly excited synchronous machine 14 because this winding capacitance 10 is parallel to the insulation resistance 8.

The speed of the brushlessly excited synchronous machine 14 and of the synchronous outer-pole machine 1 and inner-pole machine 2 coupled to the former is constant. For this reason, the terminal voltage at the stator winding 11 of the inner-pole machine 2 is proportional to the exciter current flowing through the rotor winding which, in turn, is a function of the fault current in the insulation resistance 8. The alternating-current voltage appearing at the terminals of the stator winding 11 is measured by an instrument 12 and is thus a measure of the fault current of the insulation resistance 8 of the rotor circuit of the brushlessly excited synchronous machine 14. A simple calibration permits a direct correlation of the magnitude of the fault current with the magnitude of the voltage measured. Such a calibration also picks up the influence of the winding capacitance 10. Through this arrangement, therefore, the rotor circuit 13 of a brushlessly excited synchronous machine 14 can be monitored for possible ground leaks continuously in the simplest manner.

What is claimed is:

1. An arrangement for detecting ground leaks in the insulated rotor circuit of a brushless synchronous machine, the synchronous machine having a rotatable shaft and being excited by means of a rotating rectifier, the arrangement comprising: two identical synchronous machines arranged on the shaft of the brushless synchronous machine; one of said identical machines being built as an outer-pole machine and the other one of said identical machines being built as an inner-pole machine, said outer-pole machine having a stator winding and supply means for supplying a constant direct-current to said stator winding, said outer-pole machine further having a rotor winding wherein an alternating rotor current is developed, said rotor winding of the outer-pole machine being electrically connected to the insulation resistance of the rotor circuit of the brushless synchronous machine; rectifier means for rectifying the alternating-current of said rotor of said outer-pole machine; the other one of said identical machines being built as an inner-pole machine having a stator winding and having a rotor winding connected to said rectifier means for receiving said rotor current rectified by said rectifier means whereby a voltage is induced in said stator winding of said inner-pole machine which is dependent upon the current in the insulation of said brushless synchronous machine; and, measuring means for measuring said last-mentioned voltage.

2. The arrangement of claim 1, said rectifier means being connected between said rotor winding of said outer-pole machine and said insulation of said brushless synchronous machine.

3. The arrangement of claim 1 wherein the brushless synchronous machine defines an electrical ground terminal and wherein the rotor circuit thereof includes a neutral node, said rectifier means being a rectified bridge having a pair of direct-current terminals and having a pair of alternating-current terminals, said rotor winding of said inner-pole machine being connected to said direct-current terminals and said rotor winding of said outer-pole machine being connected through said alternating-current terminals between said ground and said neutral node of said brushless synchronous machine.

4. The arrangement of claim 3, each of said two identical synchronous machines being configured as a single-phase machine.

5. The arrangement of claim 1, each of said two identical synchronous machines being configured as a single-phase machine.

6. The arrangement of claim 1, said identical synchronous machine being coupled to the end of said shaft of said brushless synchronous machine.

* * * * *